United States Patent
Tojyo et al.

[11] Patent Number: 5,924,002
[45] Date of Patent: Jul. 13, 1999

[54] METHOD OF MANUFACTURING A SEMICONDUCTOR DEVICE HAVING OHMIC ELECTRODE

[75] Inventors: Tsuyoshi Tojyo; Futoshi Hiei, both of Kanagawa, Japan

[73] Assignee: Sony Corporation, Tokyo, Japan

[21] Appl. No.: 08/575,074

[22] Filed: Dec. 19, 1995

[30] Foreign Application Priority Data

Dec. 22, 1994 [JP] Japan .................................. 6-320716

[51] Int. Cl.$^6$ .................................................. H01L 21/28
[52] U.S. Cl. ........................ 438/602; 438/597; 438/603; 438/660
[58] Field of Search .................. 438/597, 602, 438/603, 605, 660

[56] References Cited

U.S. PATENT DOCUMENTS

| | | | |
|---|---|---|---|
| 5,284,798 | 2/1994 | Ibuka et al. | 437/184 |
| 5,309,022 | 5/1994 | Gill et al. | 437/184 |
| 5,387,549 | 2/1995 | Kobayashi | 437/184 |
| 5,393,698 | 2/1995 | Kaiser et al. | 437/179 |

FOREIGN PATENT DOCUMENTS

| | | | |
|---|---|---|---|
| 0074280 | 6/1977 | Japan . | |
| 0030171 | 2/1983 | Japan . | |
| 0058326 | 2/1990 | Japan | 437/184 |

OTHER PUBLICATIONS

Patrick et al., "Low–temperature annoaled contacts to very thin GaAs epilayers", Appl. Phys. Lett. 48(15), Apr. 1986, pp. 986–988.

*Primary Examiner*—Tuan H. Nguyen
*Attorney, Agent, or Firm*—Hill & Simpson

[57] ABSTRACT

A semiconductor device having an ohmic electrode having a satisfactory ohmic contact to an n-type GaAs can be obtained by heat treatment at low temperature. A method of manufacturing the semiconductor device having the ohmic electrode includes two processes. In the first process, a metal layer containing Ni, Sn and AuGe is formed on one main surface of the n-type GaAs. In the second process, the n-type GaAs is subjected to a heat treatment at a temperature which is equal to or higher than 190 C. and equal to or lower than 300 C. Thus, the ohmic electrode is formed on the one main surface of the n-type GaAs.

5 Claims, 5 Drawing Sheets

METHOD OF MANUFACTURING A SEMICONDUCTOR DEVICE HAVING OHMIC ELECTRODE

BACKGROUND OF THE INVENTION

1. Field of the Invention:

The present invention relates to a semiconductor device having an ohmic electrode and a method of manufacturing the same.

2. Description of the Related Art:

A III–V compound semiconductor device or various kinds of II–VI compound semiconductor devices including a II–VI compound semiconductor light emitting device often employ an arrangement in which a semiconductor layer is epitaxially grown on a GaAs substrate.

This arrangement requires a process of forming an ohmic electrode on the GaAs substrate. The ohmic electrode having ohmic contact to an n-type GaAs substrate includes an electrode made of Ni and AuGe disclosed in a paper by Sharma et al. in "SEMICONDUCTORS AND SEMIMETALS" Vol.15, p1. This thesis discloses that when the electrode is manufactured by evaporating AuGe on the GaAs substrate and further evaporating Ni on the evaporated AuGe and thereafter the manufactured electrode is subjected to a heat treatment, during the heat treatment, a contact resistance of the electrode is sharply lowered around 350° C. and have a minimum value when the temperature of the heat treatment is within the range of 400° C. to 450° C.

A paper by Kelly et al. in "ELECTRONICS LETTERS" Vol. 14, No. 4 (1978) discloses an ohmic electrode made of Au-SnNi-Au as the ohmic electrode having ohmic contact to the n-type GaAs substrate. Study of FIG. 1 in this paper reveals that a contact resistance of the ohmic electrode can have a minimum value only at a temperature of 300° C. or higher.

A paper by Aydinli et al. in "J.Electrochem. Soc." Vol. 128, No. 12 (1981) discloses an ohmic electrode made of Au/Ni/SnNi. This paper discloses that when samples of the ohmic electrode are respectively subjected to heat treatments at 232° C., 328° C., and 420° C., no diffusion of metal into the GaAs substrate is observed in a sample subjected to the heat treatment at 232° C. but an ohmic contact is achieved in each of the samples subjected to the heat treatment at 328° C. and 420° C. though each of them does not have a mirror surface on its surface.

A paper by Okuyama et al. in "ELECTRONIC LETTERS" Vol. 28, No. 19 (1992) discloses a II–VI compound semiconductor laser employing an n-type GaAs substrate . This paper discloses that the n-type electrode is made of In.

A heat treatment at high temperature is necessary in order that the In electrode has a satisfactory ohmic contact to the n-type GaAs substrate.

Since, for example, a II–VI compound semiconductor light emitting device can emit short wavelength light, e.g., blue light, the II–VI compound semiconductor light emitting device attracts much attention as a light source which allows high recording density in optical recording and reproduction and allows higher resolution in photolithography. The II–VI compound semiconductor light emitting device is formed by epitaxially growing at least an n-type cladding layer, an active layer and a p-type cladding layer which compose a semiconductor light emitting device, e.g., a semiconductor laser on the n-type GaAs substrate by some proper method such as molecular beam epitaxy (MBE) or the like. If the II–VI compound semiconductor light emitting device is subjected to the above-mentioned heat treatment at high temperature for forming an ohmic electrode with a low resistance in a state that such semiconductor layers are eptaxially grown, then it leads to generation and growth of lattice defects such as stacking fault or the like. Further, such generation and growth lower a light emission characteristic and a lifetime of the semiconductor light emitting device. Therefore, it is desirable to avoid carrying out the heat treatment at high temperature.

In order to avoid such heat treatment, there can be considered a method in which an n-type electrode is formed on the GaAs substrate before the semiconductor layers are epitaxially grown. However, when semiconductor layers are epitaxially grown on the gaas substrate in such electrode forming method, impurities may be introduced into semiconductors or semiconductor layers may be contaminated with impurities, thereby satisfactory epitaxial growth being prevented. Therefore, it is desirable to avoid such electrode forming method as much as possible.

When the semiconductor layers are epitaxially grown on the GaAs substrate and then a thickness of the GaAs substrate is decreased by planing and grinding the GaAs substrate from its rear surface, it is impossible to employ the method of forming the electrode on the rear surface of the GaAs substrate before the epitaxial growth of the semiconductor layers.

When the ohmic electrode is formed on the n-type GaAs substrate by a heat treatment at low temperature, it is possible to employ some methods, e.g., a method of increasing electron density in the n-type GaAs substrate.

However, when the electron density in the n-type GaAs substrate is increased, defect density in the n-type GaAs substrate is increased.

SUMMARY OF THE INVENTION

In view of such aspects, an object of the present invention is to provide a semiconductor device having an ohmic electrode having an ohmic contact to a n-type GaAs and a method of manufacturing the same which can improve a light emission characteristic of a light emitting device formed of a II–VI compound semiconductor, for example, and increase a lifetime of the light emitting device.

According to a first aspect of the present invention, a method of manufacturing a semiconductor device having an ohmic electrode includes two processes. In the first process, a metal layer containing Ni, Sn and AuGe is formed on one main surface of the n-type GaAs. In the second process, the n-type GaAs and the metal layer are subjected to a heat treatment at a temperature which is equal to or higher than 190° C. and equal to or lower than 300° C. Thus, an ohmic electrode is formed on the one main surface of the n-type GaAs.

According to a second aspect of the present invention, a semiconductor device having an ohmic electrode is proposed in which an n-type ohmic electrode made of metals including Ni, Sn and AuGe and formed on one main surface of an n-type GaAs, and at least an n-type cladding layer, an active layer, a p-type cladding layer and a p-type ohmic electrode are formed on the one main surface or the other main surface of the n-type GaAs. At least one of the n-type cladding layer and the p-type cladding layer is formed of a II–VI compound semiconductor layer.

According to the present invention, even if the ohmic electrode is formed on the n-type GaAs after the II–VI compound semiconductor layer is formed thereon, it is possible to provide the semiconductor device having the ohmic electrode having the satisfactory ohmic contact with low contact resistance without lattice defect being increased.

The reason for this advantage is as follows. Specifically, according to the present invention, since the ohmic electrode is formed of Sn having a low melting point, AuGe having a low melting point and containing Ge serving as an n-type impurity for the GaAs, and Ni having satisfactory adhesion to the GaAs and having an effect to prevent cohesion of the metal layers forming the electrode, i.e., a so-called ball-up, after the heat treatment, it is possible to satisfactorily form the ohmic electrode on the n-type GaAs at the low heat treatment temperature of 300° C. or lower.

Moreover, since the metal layers of Ni, Sn and AuGe are successively laminated on the n-type GaAs in that order, it is possible to more effectively carry out diffusion of Sn and Ge into the GaAs and prevention of the ball-up or the like.

DESCRIPTION OF THE PREFERRED EMBODIMENTS

A semiconductor device having an ohmic contact and a method of manufacturing the same according to an embodiment of the present invention will hereinafter be described with reference to the accompanying drawings. In this embodiment, the present invention is applied to a II–VI compound semiconductor light emitting device shown in FIG. 1, e.g., a semiconductor laser, having semiconductor layers formed on its n-type GaAs substrate, and a method of manufacturing the II–VI compound semiconductor light emitting device.

Figure 1:
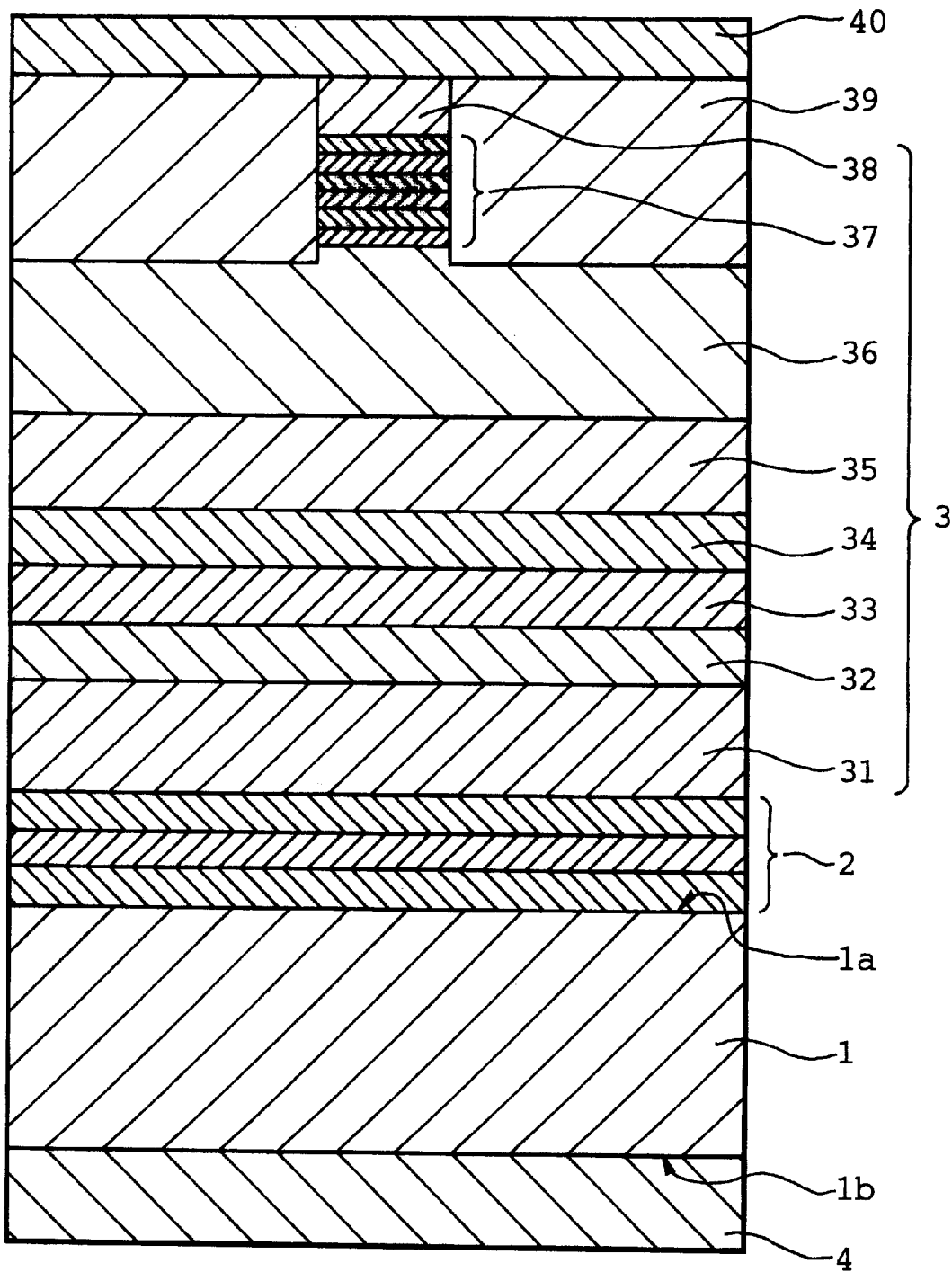
FIG. 1 is a cross-sectional view showing a II–VI compound semiconductor light emitting device which is an example of a semiconductor device having an ohmic electrode according to the present invention.

In this embodiment, as shown in FIG. 1, the II–VI compound semiconductor light emitting device has an n-type GaAs substrate 1, a buffer layer 2 formed on one main surface 1a thereof, and a II–VI compound semiconductor layer 3 formed on the buffer layer 2. The buffer layer 2 is formed by epitaxially growing an n-type GaAs layer, an n-type ZnSe layer and an n-type ZnSSe layer on the one main surface 1a of the N-type GaAs substrate 1 successively. The II–VI compound semiconductor layer 3 is formed by successively growing a first cladding layer 31 made of n-type ZnMgSSe, a first guide layer 32 made of ZnSSe, an active layer 33 having a single quantum well (SQW) structure formed of ZnCdSe, a second guide layer 34 made of ZnSSe, a second cladding layer 35 made of p-type ZnMgSSe, a cap layer 36 made of p-type ZnSSe, a multiple quantum well (MQW) structure layer 37 having p-type ZnSe thin films and ZnTe thin films which are laminated repeatedly, and a contact layer 38 made of p-type ZnTe, on the buffer layer 2 by the MBE. When each of the semiconductor layers of the II–VI compound semiconductor light emitting device is grown epitaxially, a metal organic chemical vapor deposition (MOCVD) method may be employed instead of the MBE method.

The II–VI compound semiconductor layer 3 is etched from its contact layer 38 side to the cap layer 36 through the MQW structure layer 37 to remove its both side portions with a stripe operation portion located therebetween in the direction perpendicular to the sheet of FIG. 1 being left. Insulating layers made of polyimide resin, $Al_2O$ or the like are deposited in the etched portions. Thus, a current confinement portion 39 is formed.

A p-side ohmic electrode 40 is formed on the contact layer 38 by depositing a metal layer having multilayer structure formed of Pd, Pt and Au thereon.

An n-side electrode 4 is deposited on a rear surface of the GaAs substrate 1, i.e., on the other main surface 1b thereof which is located on the opposite side of the one main surface 1a on which the II–VI compound semiconductor layer 3 is formed.

Figure 2:
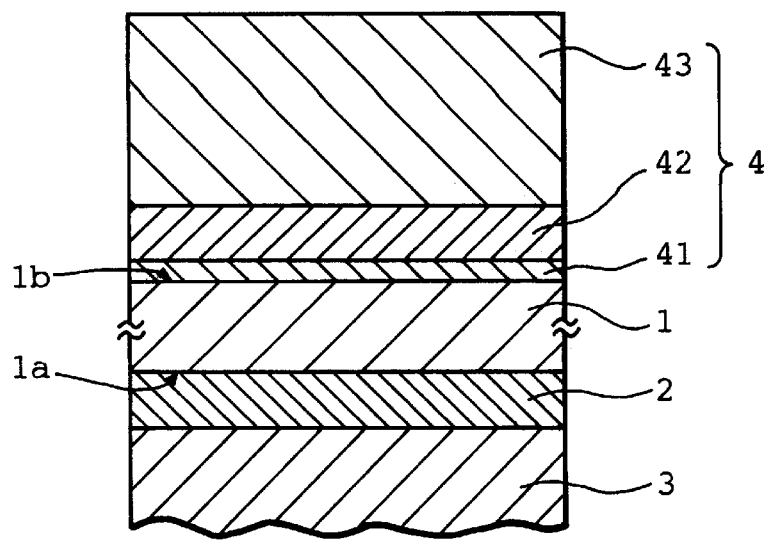
FIG. 2 is a cross-sectional view of an ohmic electrode portion used to explain a method of manufacturing the semiconductor device having the ohmic electrode according to the embodiment of the present invention.

As shown in FIG. 2, the n-side electrode 4 has a Ni thin film 41 having a thickness of 8 nm, an Sn thin film 42 having a thickness of 50 nm, and an AuGe thin film 43 (a composition ratio of Ge is 12%) having a thickness of 300 nm which are successively laminated on the other main surface 1b of the n-type GaAs substrate 1 by a proper vacuum evaporating apparatus.

After being laminated on the other main surface 1b of the n-type GaAs substrate 1, the thin films 41, 42 and 43 are subjected to a heat treatment at 200° C. in hydrogen atmosphere for five minutes, thereby being alloyed. Thus, the n-side electrode 4 which is an ohmic electrode made of Ni, Sn and AuGe is formed.

Figure 3:
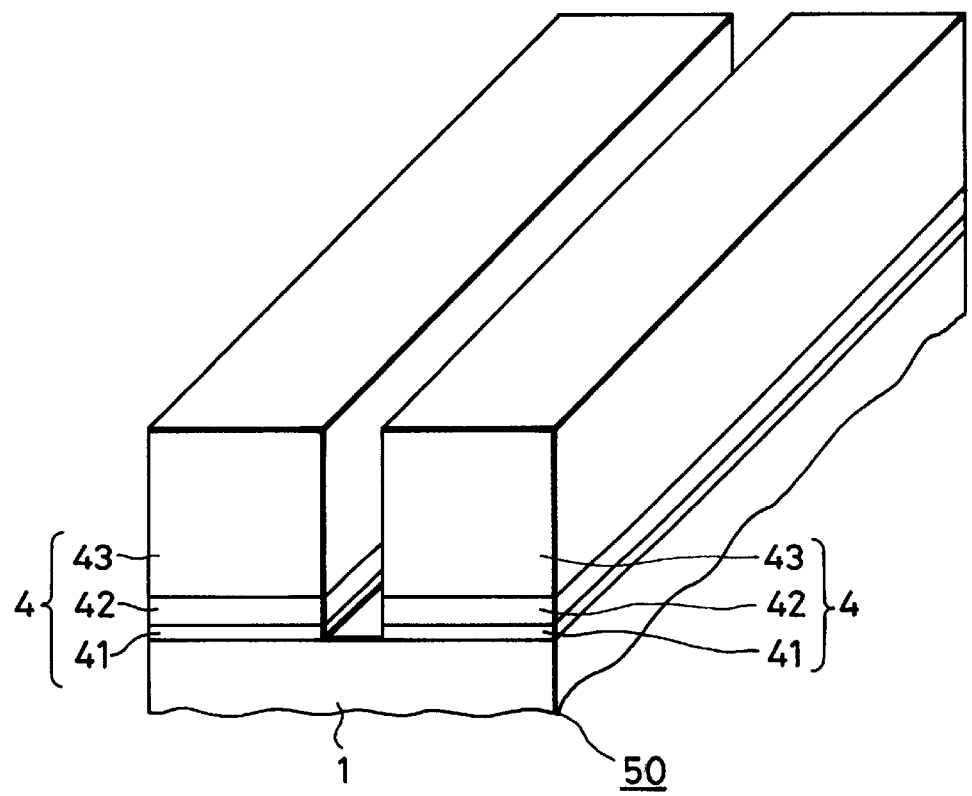
FIG. 3 is a perspective view of a sample used for measurement of a current-voltage characteristic in the ohmic electrode of the semiconductor device having the ohmic electrode according to the embodiment of the present invention.

In order to examine characteristics of the ohmic electrode composing the above n-side electrode 4, a sample 50 shown in FIG. 3 was manufactured as follows. Specifically, as shown in FIG. 3, the Ni thin film 41 having a thickness of 8 nm, the Sn thin film 42 having a thickness of 50 nm, and the AuGe thin film 43 having a thickness of 300 nm were successively laminated on the other main surface 1b of the n-type GaAs substrate 1 by a proper vacuum evaporating apparatus, thereby the n-side electrode 4 being formed. The n-side electrode 4 was subjected to the heat treatment at 200° C. in the above hydrogen atmosphere for five minutes. Thus, the sample 50 having a pair of n-side electrodes 4 located in parallel on the GaAs substrate 1 was manufactured. A current-voltage characteristic of the sample 50 was measured. The measured results are shown in FIG. 4.

Figure 4:
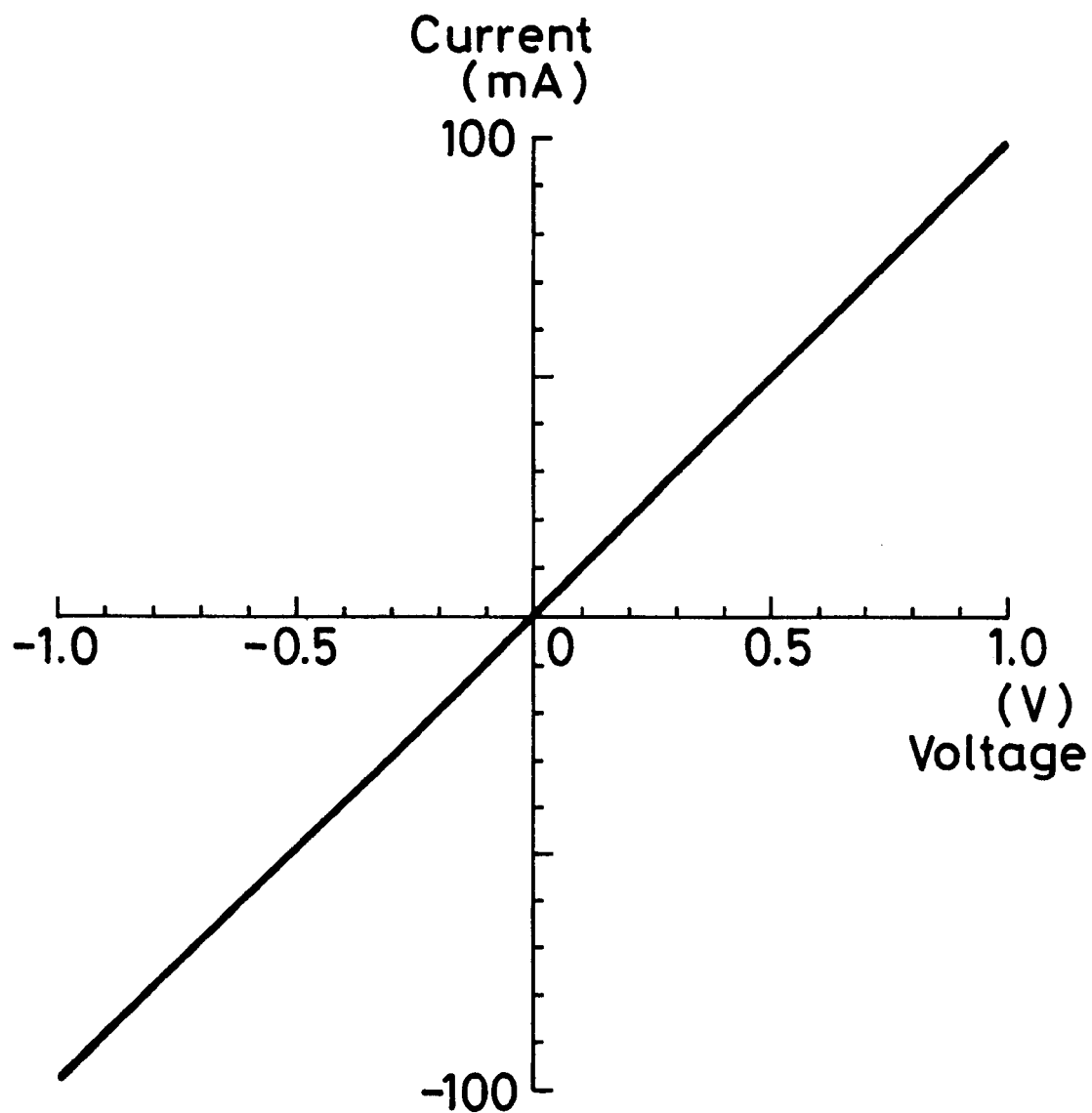
FIG. 4 is a graph showing the current-voltage characteristic of the sample shown in FIG. 3.

Study of FIG. 4 reveals that a ratio of a voltage to a current, i.e., a resistance is constant and hence a satisfactory ohmic characteristic is achieved.

Figure 5:
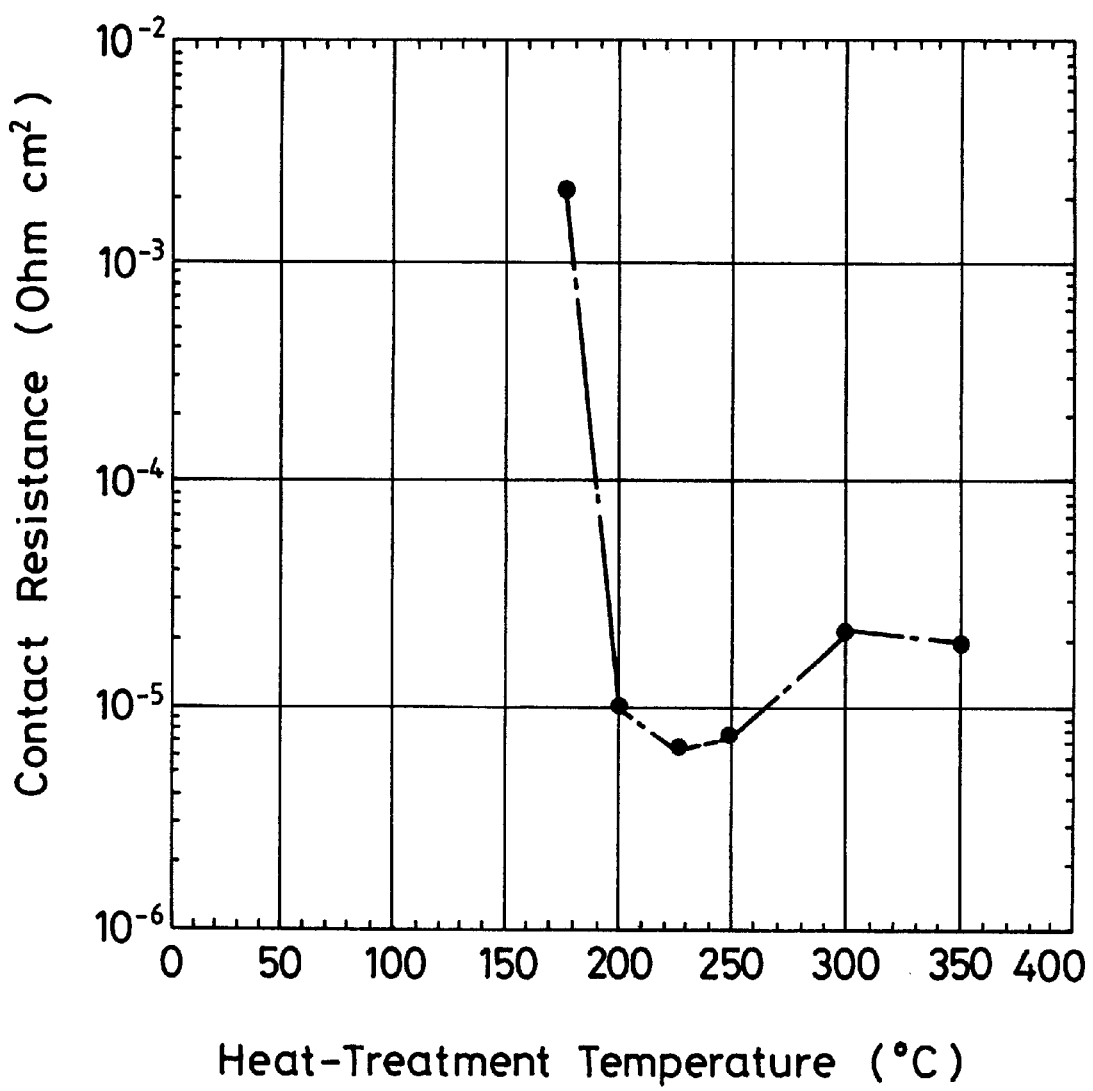
FIG. 5 is a graph showing correlation between a heat-treatment temperature and a contact resistance in the ohmic electrode of the semiconductor device having the ohmic electrode according to the embodiment of the present invention.

Further, a contact resistance of the ohmic electrode of the semiconductor device having the ohmic electrode according to the present invention was measured with a temperature during the heat treatment being changed. FIG. 5 shows results of the measurement. Study of FIG. 5 reveals that the contact resistance was lowered to about $10^{-5}$ (Ohm cm$^2$) when the heat treatment was carried out at 190° C. or greater and that the contact resistance became especially low when the heat treatment was carried out at the temperature ranging from 200° C. to 225° C.

The temperature at which the heat treatment is carried out to form the n-side electrode 4 is determined in consideration of a required resistivity and a degree of deterioration of the II–VI compound semiconductor light emitting device. Study of the temperature characteristic of the contact resistance shown in FIG. 5 reveals that the resistivity becomes minimum when the temperature of the heat treatment is around 225° C. On the other hand, as described above, the II–VI compound semiconductor light emitting device tends to have produced lattice defects as the temperature of the heat treatment is higher, particularly when it exceeds 300° C. In view of these facts, the heat treatment is carried out at the temperature ranging from 190° C. to 300° C., preferably from 200° C. to 250° C.

A thickness of the formed Ni thin film 41 is preferably set within the range from 5 nm to 15 nm. When the thickness is thus set, it is possible to lower the contact resistance of the n-side electrode 4 relative to the GaAs substrate 1. Specifically, when the thickness of the Ni thin film 41 is smaller than 5 nm, it is impossible to achieve a sufficient effect presented by forming the Ni thin film. When the thickness of the Ni thin film 41 exceeds 15 nm, the Ni thin film 41 prevents diffusion of Ge, thereby lowering an effect presented by Ge as an n-type donor. In each of the above cases, the ohmic characteristic of the n-side electrode 4 is lowered.

A thickness of the AuGe thin film 43 is set within the range from 50 nm to 200 nm, e.g., to about 150 nm. When the thickness is thus set, it is possible to prevent the AuGe thin film 43 from being peeled off from the Sn thin film 42 when the heat treatment for alloying Ni, Sn and AuGe is being carried out.

When a ratio of Ge in an alloy composition of the above AuGe thin film 43 is set to 12% a melting point of the AuGe thin film 43 becomes the lowest temperature (i.e., 365° C.). At this time, it is possible to select lower temperature of the heat treatment, which facilitates alloying the AuGe thin film 43. Accordingly, it becomes facilitated to form the ohmic electrode 4.

Figure 6:
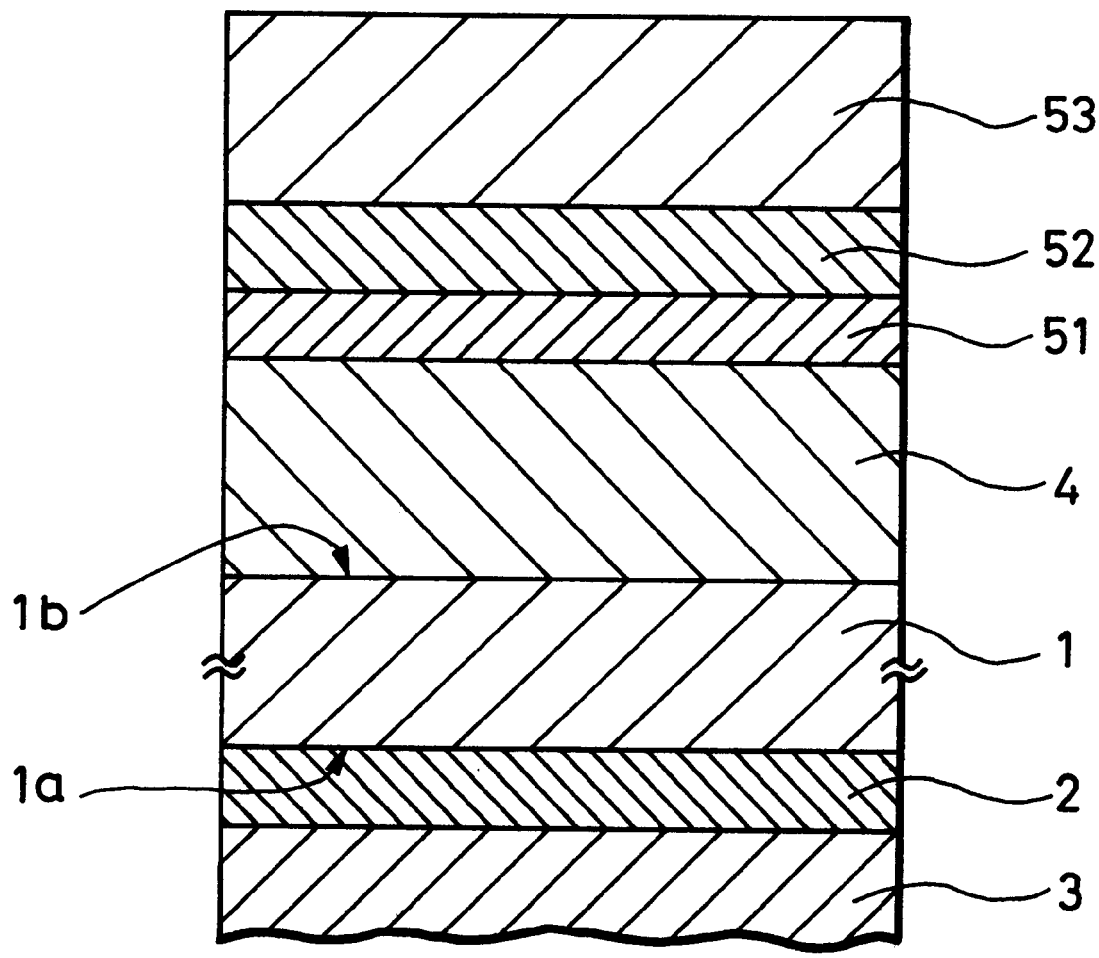
FIG. 6 is a cross-sectional view of the ohmic electrode portion used to explain a method of manufacturing the semiconductor device having the ohmic electrode according to another embodiment of the present invention.

FIG. 6 shows another embodiment in which metal thin films are further laminated on the n-side alloyed electrode 4 shown in FIG. 1 and 2. When Ni, Sn and AuGe of the n-side electrode 4 are alloyed and then a Ti thin film 51, a Pt thin film 52 and a Au thin film 53 are successively laminated on the n-side electrode 4 as shown in FIG. 6, it is possible to obtain the ohmic electrode having an excellent adhesion. In this arrangement shown in FIG. 6, the thicknesses of the Ti thin film 51, the Pt thin film 52, and the Au thin film 53 are set to 5 nm, 10 nm, and 300 nm, respectively.

The other main surface 1b of the GaAs substrate 1 on which the n-side electrode 4 is to be deposited may be subjected to a lapping processing before the n-side electrode 4 is deposited thereon. This lapping processing is carried out by grinding the other main surface 1b of the GaAs substrate 1 mechanically and chemically such that the GaAs substrate 1 has a predetermined thickness, e.g., about 100 µm. The above-mentioned materials, for example, of Ni, Sn, and AuGe composing the n-side electrode 4 are successively deposited on the ground main surface 1b by a proper method such as evaporation or the like and then alloyed by the heat treatment. This lapping processing is carried out when a film thickness of the GaAs substrate 1 is decreased in order to facilitate a fine working of the semiconductor light emitting device shown in FIG. 1.

While the semiconductor light emitting device, e.g., the semiconductor laser formed of the II–VI compound semiconductor layer 3 is formed on the n-type GaAs substrate 1 in this embodiment, the present invention is not limited thereto. The present invention can be applied to fabrication of a semiconductor device having an ohmic electrode which is formed of other semiconductor devices or other compound semiconductor layer or the like.

While in the above-mentioned embodiment the semiconductor device (the semiconductor light emitting device in the embodiment) is formed by epitaxially growing the semiconductor layer 3 on the one main surface 1a of the GaAs substrate 1 and the ohmic electrode 4 is formed on the other main surface 1b thereof, the present invention is not limited thereto. The present invention can be applied to formation of the semiconductor device and the electrode 4 having the ohmic contact to the GaAs substrate 1 on the same main surface of the GaAs substrate 1. For example, the present invention can be applied to a semiconductor light emitting device proposed in "a semiconductor color light emitting device" (Japanese laid-open patent publication No. 48286/1994) filed by the same assignee, the semiconductor light emitting device being arranged such that a large number of light emitting devices are formed and arranged on one main surface of a GaAs substrate and an electrode is formed on the same main surface.

According to the present invention, it is possible to form the ohmic electrode 4 having a small contact resistance on the n-type GaAs substrate 1 by the heat treatment at a low temperature of 300° C. or lower, e.g., of about 200° C. Therefore, it is possible to deposit the ohmic electrode 4 on the n-type GaAs substrate 1 after the II–VI compound semiconductor layer 3 is epitaxially grown thereon. Specifically, when the II–VI compound semiconductor light emitting device is manufactured, even if the II–VI compound semiconductor layer 3 composing the II–VI compound semiconductor light emitting device is grown on the n-type GaAs substrate 1 by epitaxy and thereafter the n-side electrode 4 is formed on the n-type GaAs substrate 1, it is possible to avoid the deterioration of the characteristics of the II–VI compound semiconductor light emitting device, such as generation of the lattice defects or the like, and a factor to lower the lifetime thereof. As a result, it is possible to manufacture the II–VI compound semiconductor light emitting device, e.g., the blue laser, having satisfactory characteristics.

As described above, since the electrode 4 can be formed after the II–VI compound semiconductor layer 3 is grown by epitaxy on the GaAs substrate 1 and then this GaAs substrate is subjected to the lapping processing, it is possible to increase the lifetime of the semiconductor light emitting device such as a laser or the like. Since the whole thickness of the semiconductor light emitting device can be decreased in this case, it is possible to increase the degree of freedom in design of the semiconductor device employing such light emitting device.

Having described preferred embodiments of the present invention with reference to the accompanying drawings, it is to be understood that the present invention is not limited to the above-mentioned embodiments and that various changes and modifications, such as changes of thickness of a thin film, changes of conditions of a heat treatment or the like, can be effected therein by one skilled in the art without departing from the spirit or scope of the present invention as defined in the appended claims.

What is claimed is:

1. A method of manufacturing a semiconductor device having an ohmic electrode, comprising the steps of:

forming a metal layer containing Ni, Sn and AuGe on one main surface of an n-type GaAs; and subjecting said n-type GaAs and said metal layer to a heat treatment at a temperature which is equal to or higher than 190° C. and equal to or lower than 300° C., whereby an ohmic electrode is formed on said one main surface of said n-type GaAs.

2. A method of manufacturing a semiconductor device having an ohmic electrode according to claim 1, wherein said metal layer is formed by forming Ni, Sn and AuGe successively from the side of said n-type GaAs in that order.

3. A method of manufacturing a semiconductor device having an ohmic electrode according to claim 1, wherein before said metal layer is formed, a II–VI compound semiconductor layer is formed on said one main surface or the other main surface of the said n-type GaAs.

4. A method of manufacturing a semiconductor device having an ohmic electrode according to claim 3, wherein said II–VI compound semiconductor layer is formed by a molecular beam epitaxy method.

5. A method of manufacturing a semiconductor device having an ohmic electrode according to claim 1, wherein after said heat treatment is carried out, metal layers made of Ti, Pt and Au are successively formed on said metal layer made of AuGe in that order.

* * * * *